(12) United States Patent
Tan et al.

(10) Patent No.: US 9,343,662 B2
(45) Date of Patent: May 17, 2016

(54) MAGNETIC MEMORY DEVICE AND METHOD OF FORMING THEREOF

(71) Applicant: GLOBALFOUNDRIES Singapore Pte. Ltd., Singapore (SG)

(72) Inventors: Juan Boon Tan, Singapore (SG); Wanbing Yi, Singapore (SG); Danny Pak-Chum Shum, Singapore (SG); Yi Jiang, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/483,171

(22) Filed: Sep. 11, 2014

(65) Prior Publication Data

US 2015/0069561 A1    Mar. 12, 2015

Related U.S. Application Data

(60) Provisional application No. 61/877,279, filed on Sep. 12, 2013.

(51) Int. Cl.
*H01L 29/82* (2006.01)
*H01L 43/12* (2006.01)
*H01L 27/22* (2006.01)
*H01L 27/115* (2006.01)

(52) U.S. Cl.
CPC .............. *H01L 43/12* (2013.01); *H01L 27/228* (2013.01); *H01L 27/11507* (2013.01)

(58) Field of Classification Search
CPC ................ H01L 23/522; H01L 27/222; H01L 27/11507; H01L 23/5226; H01L 23/5223
See application file for complete search history.

(56) References Cited

U.S. PATENT DOCUMENTS

| | | | | |
|---|---|---|---|---|
| 6,316,801 | B1* | 11/2001 | Amanuma | 257/306 |
| 2002/0105017 | A1* | 8/2002 | Kim | H01L 27/11502 257/295 |
| 2004/0021222 | A1* | 2/2004 | Mori | 257/758 |
| 2004/0142549 | A1* | 7/2004 | Yoo | 438/597 |
| 2011/0175181 | A1* | 7/2011 | Kang et al. | 257/421 |

* cited by examiner

*Primary Examiner* — Thao X Le
*Assistant Examiner* — Laura Dykes
(74) *Attorney, Agent, or Firm* — Horizon IP Pte. Ltd.

(57) ABSTRACT

A device and a method of forming a device are presented. A substrate is provided. Front end of line processing is performed to form circuit component on the substrate and back end of line processing is performed to include the uppermost inter level dielectric (ILD) layer. The uppermost ILD layer includes first and second interconnects. A pad level is formed over the uppermost ILD layer. A storage unit of a memory cell is provided in the pad level. The storage unit is coupled to the first interconnect of the uppermost ILD layer. A cell interconnect and a pad interconnect are formed in the pad level. The cell interconnect is formed on top of and coupled to the storage unit and the pad interconnect is coupled to the second interconnect in the uppermost ILD layer.

20 Claims, 16 Drawing Sheets

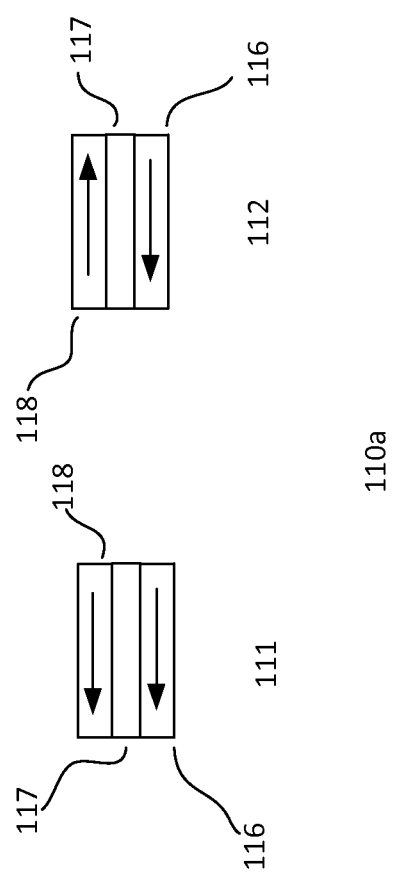

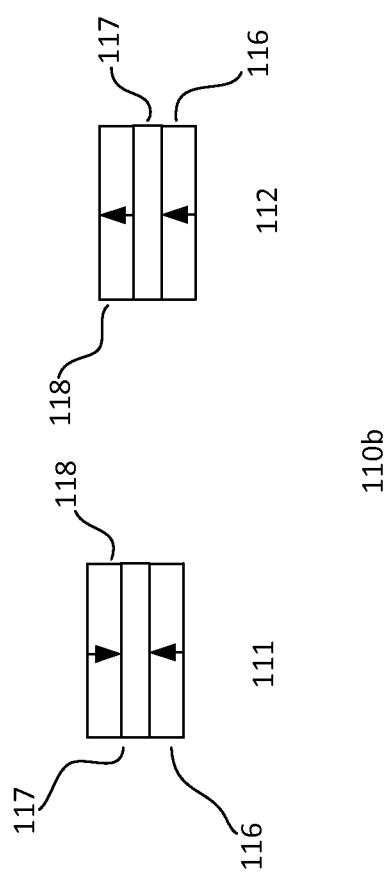

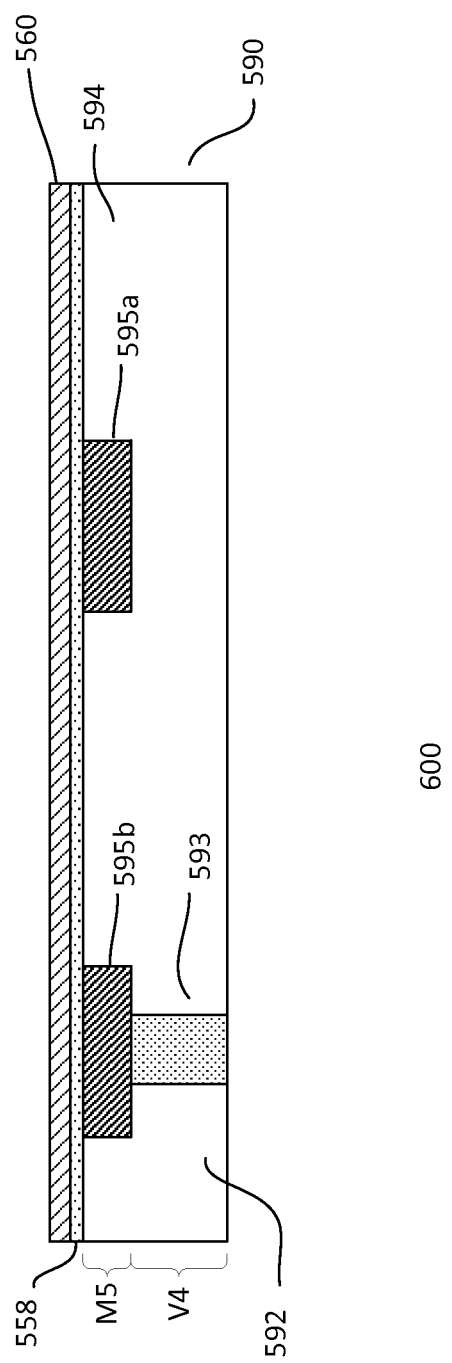

MAGNETIC MEMORY DEVICE AND METHOD OF FORMING THEREOF

CROSS-REFERENCE TO RELATED APPLICATION

This application claims the priority benefit of U.S. Provisional Application Ser. No. 61/877,279, filed on Sep. 12, 2013, which is herein incorporated by reference in its entirety.

BACKGROUND

A magnetic memory cell or device stores information by changing electrical resistance of a magnetic tunnel junction (MTJ) element. The MTJ element typically includes a fixed (pinned) magnetic layer and a free magnetic layer. The fixed (pinned) magnetic layer and the free magnetic layer are laminated such that a tunnel barrier film forms between the two layers. The magnetic orientation of the free layer flips by a direction or an opposite direction of electric currents exceeding a critical select current. The electrical resistance of the MTJ element changes corresponding to that of the magnetic orientation of the free layer relating to the fixed magnetic layer, which may be in either a parallel state or an anti-parallel state. MTJ elements, however, are very sensitive to thermal budget as high temperature processes may impact the MTJ stability.

It is desirable to provide a reliable memory device and method for forming a reliable memory device which eliminates the high temperature concern for the MTJ element. Furthermore, it is also desirable that the process is cost effective, compatible with logic processing and will not degrade the performance of other components in the device.

SUMMARY

Embodiments of the present disclosure generally relate to semiconductor device and method for forming a semiconductor device. In one embodiment, a method of forming a device is disclosed. A substrate is provided. Front end of line processing is performed to form circuit component on the substrate and back end of line processing is performed to include the uppermost inter level dielectric (ILD) layer. The uppermost ILD layer includes first and second interconnects. A pad level is formed over the uppermost ILD layer. A storage unit of a memory cell is provided in the pad level. The storage unit is coupled to the first interconnect of the uppermost ILD layer. A cell interconnect and a pad interconnect are formed in the pad level. The cell interconnect is formed on top of and coupled to the storage unit and the pad interconnect is coupled to the second interconnect in the uppermost ILD layer.

In another embodiment, a device is presented. The device includes a substrate having circuit component and a dielectric layer disposed over the substrate. The dielectric layer includes a plurality of inter level dielectric (ILD) layers and the uppermost dielectric layer includes first and second interconnects. A pad level is disposed over the uppermost ILD layer. A storage unit of a memory cell is disposed in the pad level. The storage unit is coupled to the first interconnect of the uppermost ILD layer. A cell interconnect and a pad interconnect are disposed in the pad level. The cell interconnect is disposed on top of and coupled to the storage unit and the pad interconnect is coupled to the second interconnect in the uppermost ILD layer.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIGS. 1a-1b show diagrams of parallel state and anti-parallel state of an MTJ element;

FIGS. 6a-6i show cross-sectional views of an embodiment of a process for forming a memory cell.

DETAILED DESCRIPTION

Figure 2A:
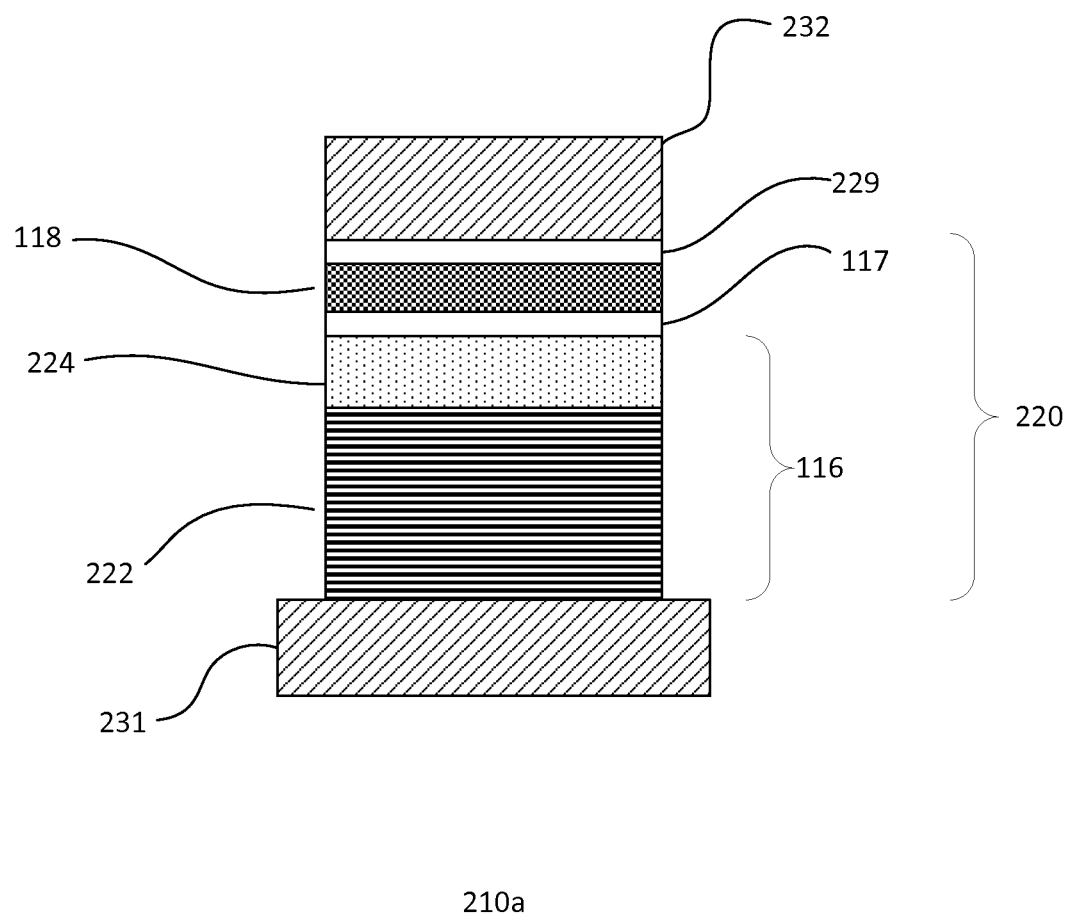
FIGS. 2a-2b show cross-sectional views of embodiments of MTJ elements.

Embodiments of the present disclosure generally relate to memory cells or devices. In one embodiment, the memory cells are magnetoresistive memory cells. For example, the memory devices may be spin transfer torque magnetoresistive random access memory (STT-MRAM) devices. Magnetoresistive memory cells include magnetic tunneling junction (MTJ) elements. Other suitable types of memory cells may also be useful. Such memory devices, for example, may be incorporated into standalone memory devices including, but not limited to, USB or other types of portable storage units, or ICs, such as microcontrollers or system on chips (SoCs). The devices or ICs may be incorporated into or used with, for example, consumer electronic products, or relate to other types of devices.

FIG. 1a shows a simplified cross-sectional view of an embodiment of a MTJ element 110a. As shown, the magnetization or magnetic orientations of the magnetic element is configured to be in the horizontal direction. Horizontal direction, for example, refers to the direction along or parallel to the surface of a substrate. A MTJ element includes a magnetically fixed (pinned) layer 116, a tunneling barrier layer 117 and a magnetically free layer 118. The magnetic orientation of the fixed layer is fixed while the magnetic orientation of the free layer may be programmed to be in a first or same direction as the fixed layer or in a second or opposite direction as the fixed layer. For example, as shown by structure 111, the magnetic direction of the free layer is programmed to be in the first or parallel direction as the fixed layer. The corresponding MTJ electrical resistance between the free layer 118 and the fixed layer 116 is denoted as $R_P$. Structure 112 illustrates that the magnetization of the free layer is programmed to be in a second or anti-parallel direction as the fixed layer. The corresponding MTJ electrical resistance between the free layer 118 and the fixed layer 116 is denoted as $R_{AP}$. The resistance $R_{AP}$ is higher than resistance $R_P$.

FIG. 1b shows vertical alignment of magnetic orientations in the magnetic layers of a MTJ element 110b. Vertical, for example, refers to the direction perpendicular to a substrate surface. As shown in FIG. 1b, MTJ element 110b includes a fixed (pinned) layer 116, a barrier layer 117 and a free layer 118. When MTJ element 110b is in a magnetic anti-parallel state 111, magnetic orientations of the free layer 118 and the fixed layer 116 are in opposite directions. The corresponding MTJ electrical resistance between the free layer 118 and the fixed layer 116 is denoted as $R_{AP}$. When MTJ element 110b is in a magnetic parallel state 112, magnetic orientations of the free layer 118 and the fixed layer 116 are in the same direction. The corresponding MTJ electrical resistance between the free layer 118 and the fixed layer 116 is denoted as $R_P$.

Figure 2B:
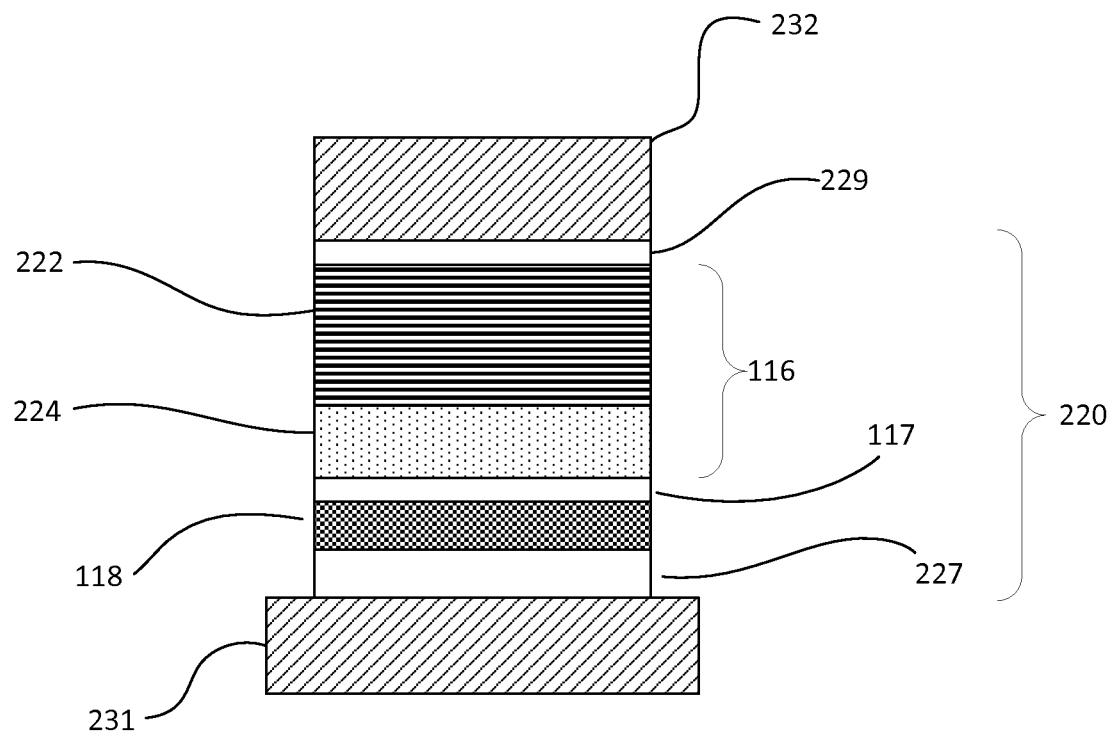

FIGS. 2a-2b show cross-sectional views of exemplary embodiments of MTJ stacks or elements. FIG. 2a shows a bottom-pinned MTJ element 210a and FIG. 2b shows a top-pinned MTJ element 210b. Top and bottom refer to position of layers relative to the substrate surface.

As shown in FIG. 2a, bottom-pinned MTJ stack 210a includes a bottom electrode 231, a magnetically fixed (pinned) layer 116, a tunneling barrier 117, a magnetically free layer 118, a cap layer 229 and a top electrode layer 232 on the cap layer 229. The fixed layer 116, in one embodiment, includes a magnetic layer 224 and a pinning layer 222 on the bottom electrode 231. The pinning layer, for example, pins the magnetization direction of the magnetic layer, forming a pinned layer.

The free layer may be CoFeB, the tunneling barrier layer may be MgO or $Al_2O_3$, and the magnetic layer may be CoFeB/Ru/CoFeB. As for the pinning layer, it may be PtMn or IrMn. The electrodes may be Ti, TiN, Ta, TaN or other suitable metals used in the semiconductor process. Other suitable configurations or materials of MTJ stack may also be useful.

As shown in FIG. 2b, top-pinned MTJ structure 210b includes a bottom electrode 231, a buffer layer 227, a free layer 118, a tunneling barrier 117, a fixed layer 116, a cap layer 229 and a top electrode layer 232 on the cap layer 229. The fixed layer 116, in one embodiment, includes a magnetic layer 224 and a pinning layer 222. The pinning layer, for example, pins the magnetization direction of the magnetic layer, forming a pinned layer.

The free layer may be CoFeB, the tunneling barrier layer may be MgO of $Al_2O_3$, and the free layer may be CoFeB/Ru/CoFeB. As for the pinning layer, it may be PtMn or IrMn. The electrodes may be Ti, TiN, Ta, TaN or other suitable metals used in the semiconductor process. The buffer layer may optionally be provided to maintain separation between the tunneling barrier and bottom electrode. Other suitable configurations or materials of MTJ stack may also be useful.

Figure 3:
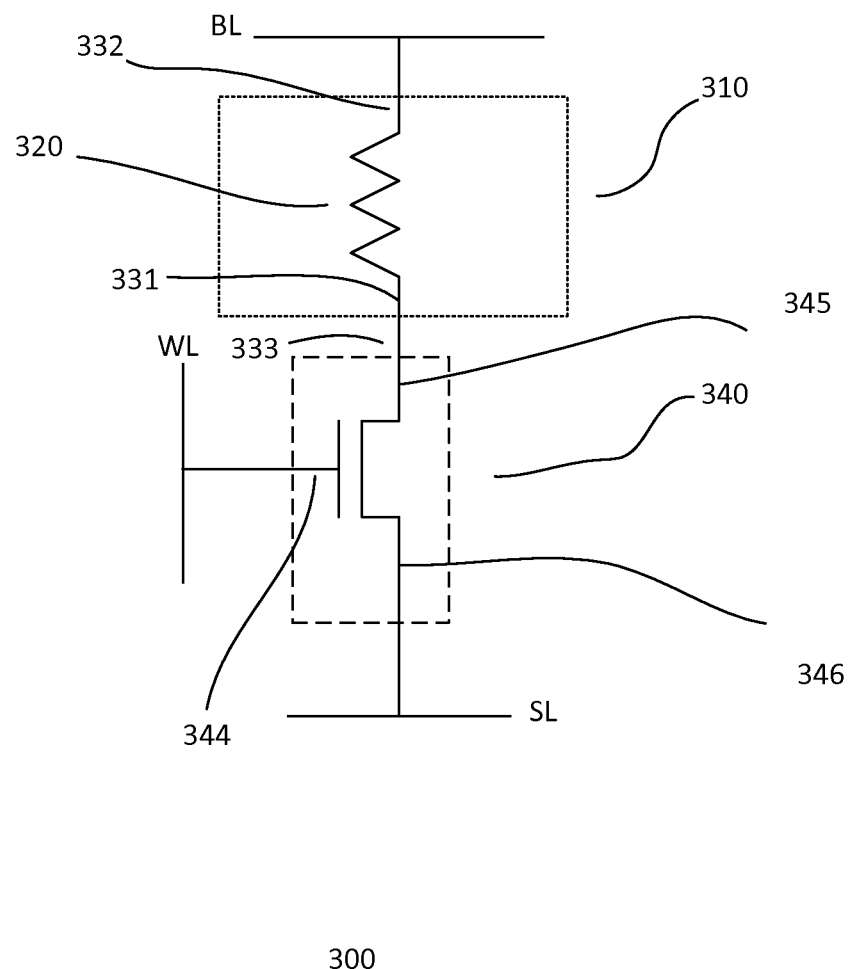
FIG. 3 shows a schematic diagram of an embodiment of a memory cell.

FIG. 3 shows a schematic diagram of an embodiment of a memory cell or device 300. The memory cell is a non-volatile memory cell. For example, the memory cell may be a magnetoresistive memory cell. In one embodiment, the memory cell is a Spin Torque Transfer-Magnetoresistive Random Access Memory (STT-MRAM) cell. Other suitable types of memory cells may also be useful. The memory cell includes a storage unit 310 and a cell selector unit 340. The storage unit is coupled to the cell selector unit. For example, the storage unit and cell selector is coupled at node 333 of the memory cell. Storage unit 310, in one embodiment, includes a storage element 320. The storage element, for example, may be resistive storage elements. In one embodiment, the storage element is a magnetoresistive memory element, such as a MTJ storage element. The MTJ element may be similar to that described in FIGS. 2a-2b. Other suitable types of MTJ or storage elements may also be useful.

The storage element includes first and second electrodes 331 and 332. The first electrode, for example, may be a bottom electrode while the second electrode may be a top electrode. Other configurations of electrodes may also be useful. In one embodiment, the top electrode of the storage element is electrically connected to a bit line (BL). The bottom electrode of the storage element is connected to the first cell node 333.

The cell selector unit includes a selector for selecting the memory cell. The selector, for example, may be a select transistor. In one embodiment, the select transistor is a metal oxide semiconductor (MOS) transistor. In one embodiment the selector is a n-type MOS transistor. The select transistor includes first and second source/drain (S/D) terminals 345 and 346 and a gate or control terminal 344. The S/D terminals, for example, are heavily doped regions with first polarity type dopants, defining the first type transistor. For example, in the case of a n-type transistor, the S/D terminals are n-type heavily doped regions. Other types of transistors or selectors may also be useful.

In one embodiment, the first terminal of the cell selector and first terminal of the storage unit are commonly coupled at the first cell node. For example, the first S/D terminal of the cell selector is coupled to the bottom electrode of the storage unit. The second terminal of the cell selector is coupled to a source line (SL). As for the gate terminal, it is coupled to a wordline WL.

Figure 4:
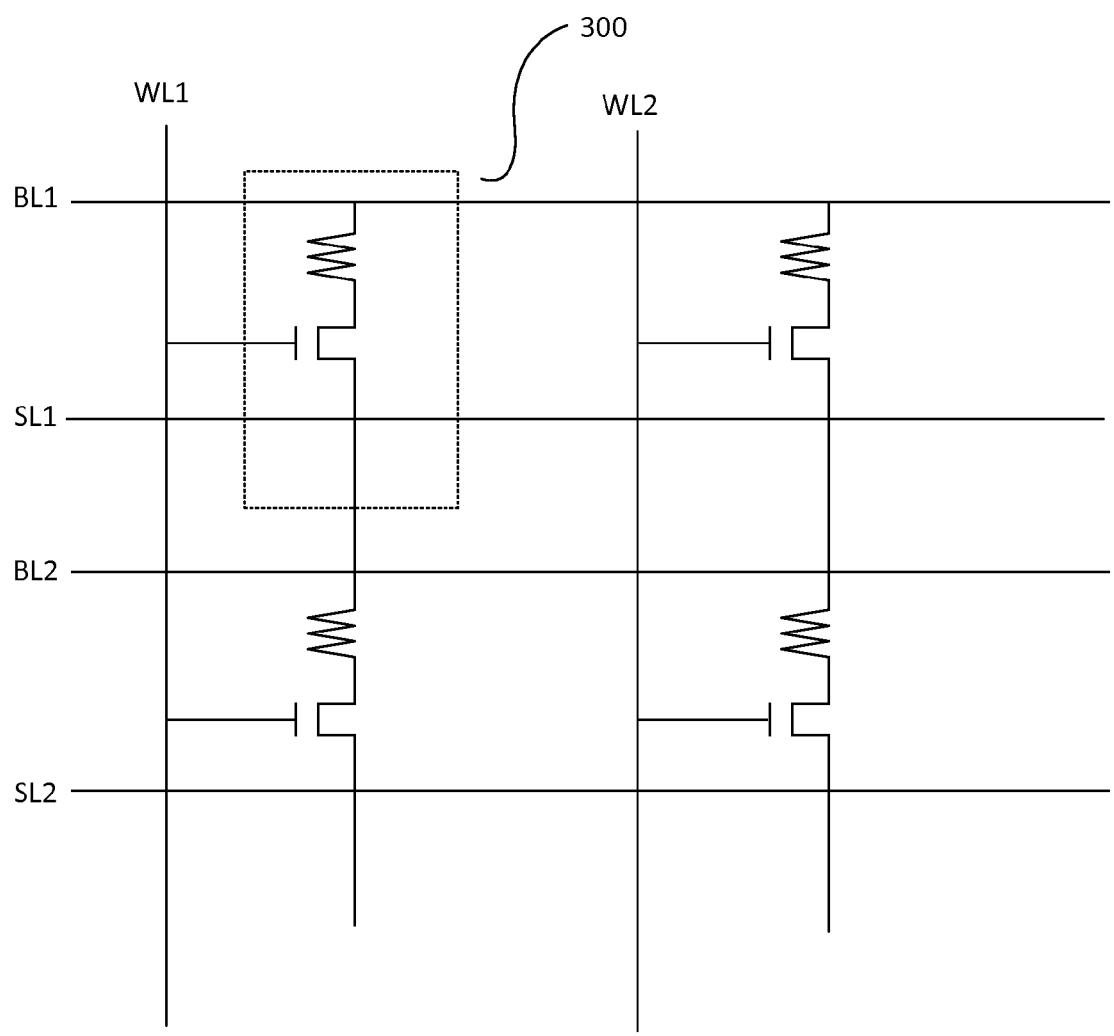
FIG. 4 shows a schematic diagram of an embodiment of a portion of a memory array.

FIG. 4 shows a schematic diagram of an embodiment of a memory array 400. The array includes a plurality of memory cells 300 interconnected. The memory cells may be similar to those described in FIG. 3. For example, the memory cells are MRAM cells, such as STT MRAM cells. Common elements may not be described or described in detail. Other suitable types of memory cells may also be useful.

As shown, the array includes four memory cells arranged in a 2×2 array. For example, the array is arranged to form two rows and two columns of memory cells. Memory cells of a row are interconnected by a wordline (WL1 or WL2) while memory cells of a column are interconnected by a bitline (BL1 or BL2). A S/D terminal is coupled to a source (SL1 or SL2). Other suitable cell configurations may also be useful. Although the array is illustrated as a 2×2 array, it is understood that arrays of other sizes may also be useful.

Figure 5:
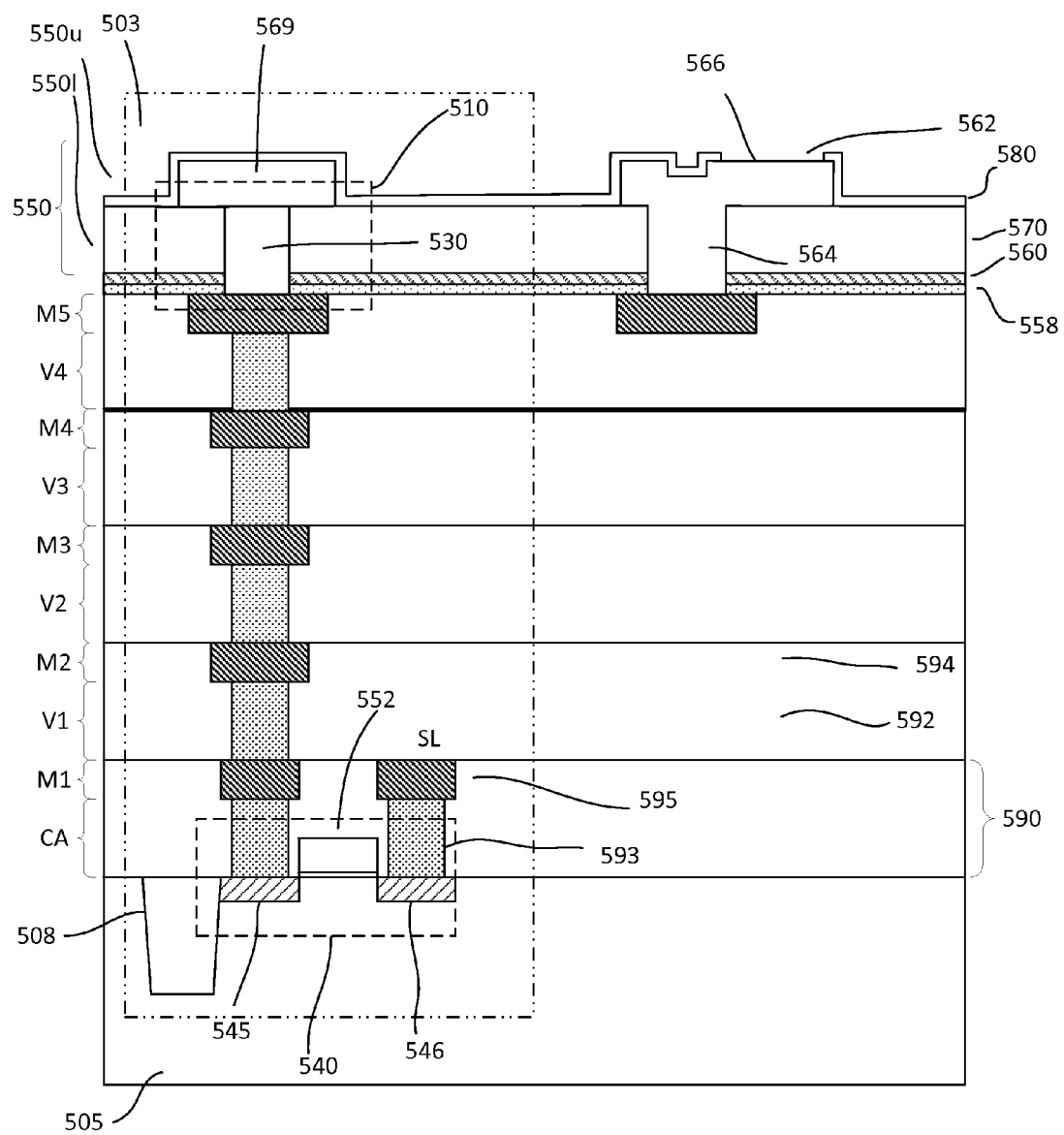
FIG. 5 shows a cross-sectional view of an embodiment of a device.

FIG. 5 shows a cross-sectional view of an embodiment of a device 500. The cross-sectional view, for example is along a second or bitline direction of the device. The device, as shown, includes a memory cell 503. The memory cell, for example, may be a NVM memory cell. The memory cell, in one embodiment, is a magnetoresistive NVM cell, such as a STT-MRAM cell. The memory cell, for example, is similar to that described in FIG. 3. Common elements may not be described or described in detail.

The memory cell is disposed on a substrate 505. For example, the memory cell is disposed in a cell region of the substrate. The cell region may be part of an array region. For example, the array region may include a plurality of cell regions. The substrate may include other types of device regions (not shown), such as high voltage (HV) as well as logic regions, including low voltage (LV) and intermediate voltage (IV) device regions. Other types of regions may also be provided.

The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, is formed from silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

Front end of line (FEOL) processing is performed on the substrate. The FEOL process, for example, forms n-type and p-type devices or transistors on the substrate. The p-type and n-type device form a complementary MOS (CMOS) device. The FEOL processing, for example, includes forming isolation regions, various device and isolation wells, transistor gates and transistor source/drain (S/D) regions and contact or diffusion regions serving as substrate or well taps. Forming other components with the FEOL process may also be useful.

Isolation regions 508, for example, serve to isolate different device regions. The isolation regions may be shallow trench isolation (STI) region. To form STI regions, trenches are formed and filled with isolation material. A planarization process, such as chemical mechanical polishing (CMP) is performed to remove excess dielectric material, forming isolation regions. Other types of isolation regions may also be useful. The isolation regions are provided to isolate device regions from other regions.

Device wells, for example, serve as bodies of p-type and n-type transistors. Device wells are doped wells. Second type doped device wells serve as bodies of first type transistors. For example, p-type device wells serve as bodies of n-type transistors and n-type device wells serve as bodies of p-type transistors. Isolation wells may be used to isolate device wells from the substrate. The isolation wells are deeper than the device wells. For example, isolation wells encompass the device wells. The isolation wells are first type doped wells. For example, n-type isolation wells are used to isolate p-type device wells. Separate implants may be employed to form different doped device wells and isolation wells using, for example, implant masks, such as photoresist masks. The wells, for example, are formed after forming isolation regions.

Gates of transistors are formed on the substrate. For example, layers of the gate 552, such as gate dielectric and gate electrode are formed on the substrate and patterned to form the gates. The gate dielectric may be a silicon oxide layer while the gate electrode layer may be polysilicon. The gate electrode may be doped, for example, to reduce sheet resistance. Other types of gate dielectric and gate electrode layers may also be useful. The gate dielectric layer may be formed by thermal oxidation and the gate electrode layer may be formed by chemical vapor deposition (CVD). Separate processes may be performed for forming gate dielectrics of the different voltage transistors. This is due to, for example, different gate dielectric thicknesses associated with the different voltage transistors. For example, HV transistor will have a thicker gate dielectric than a LV transistor.

The gate layers are patterned by, for example, mask and etch techniques. For example, a patterned photoresist mask may be provided over the gate layers. For example, a photoresist layer is formed over the gate layers and lithographically exposed by using a reticle. The mask layer is developed, forming a patterned mask with the desired pattern of the reticle. To improve lithographic resolution, an anti-reflective coating (ARC) layer may be provided between the gate layer and resist mask layer. An anisotropic etch, such as a reactive ion etch (RIE) is used to pattern the gate layers to form the gates using the patterned mask layer.

Doped contact regions 545 and 546, such as source/drain (S/D) regions and well or substrate taps are formed in exposed active regions of the substrate after forming the gates. The contact regions are heavily doped regions. Depending on the type of transistor and well tap, the contact regions may be heavily doped n-type or p-type regions. For n-type transistors, S/D regions are heavily doped n-type regions and for p-type transistors, S/D regions are heavily doped p-type regions. For well taps, they are the same dopant type as the well.

A S/D region may include lightly doped diffusion (LDD) and halo regions. A LDD region is a lightly doped region with first polarity type dopants while the halo region is a lightly doped region with second polarity type dopants. For example, the halo region includes p-type dopants for a n-type transistor while the LDD region includes n-type dopants for n-type transistors. The halo and LDD regions extend under the gate. A halo region extends farther below the gate than a LDD region. Other configurations of LDD, halo and S/D regions may also be useful.

Dielectric spacers (not shown) may be provided on the gate sidewalls of the transistors. The spacers may be used to facilitate forming transistor halo, LDD and transistor S/D regions. For example, spacers are formed after halo and LDD regions are formed. Spacers may be formed by, for example, forming a spacer layer on the substrate and anisotropically etching it to remove horizontal portions, leaving the spacers on sidewalls of the gates. After forming the spacers, an implant is performed to form the S/D regions. Separate implants may be employed to form different doped regions using, for example, implant masks, such as photoresist mask. Well taps of the same dopant type as S/D regions are formed at the same time.

As shown, the FEOL processing forms a cell region isolated by an isolation region 508, such as a STI region. The cell region is for a memory cell. Isolation regions may be provided to isolate columns of memory cells. Other configurations of isolation regions may also be useful. The cell region may include a cell device well (not shown). The cell device well, for example, serves as a body well for a transistor of the memory cell. The device well may be doped with second polarity type dopants for first polarity type transistors. The device well may be lightly or intermediately doped with second polarity type dopants. In some cases, a cell device isolation well (not shown) may be provided, encompassing the cell device well. The isolation well may have a dopant type which has the opposite polarity to that of the cell device well. For example, the isolation well may include first polarity type dopants. The isolation well serves to isolate the cell device well from the substrate. Well biases may be provided to bias the wells.

The cell device well may be a common well for the cell regions in the array region. For example the cell device well may be an array well. The cell device isolation well may serve as the array isolation well. Other configurations of device and isolation wells may also be useful. Other device regions of the device may also include device and/or device isolation wells.

The memory cell includes a cell selector unit 540 and a storage unit 510. The FEOL forms the cell selector in the cell region. The cell selector unit includes a selector for selecting the memory cell. The selector, for example, may be a select transistor. In one embodiment, the select transistor is a metal oxide semiconductor (MOS) transistor. The transistor, as shown, includes first and second source/drain (S/D) regions 545 and 546 formed in the substrate and a gate 552 disposed on the substrate between the S/D regions. The S/D regions, for example, are heavily doped regions with first polarity type dopants, defining the first type transistor. For example, in the case of a n-type transistor, the S/D regions are n-type heavily doped regions. Other types of transistors or selectors may also be useful. As for the gate, it includes a gate electrode over a gate dielectric. The gate electrode may be polysilicon while the gate dielectric may be silicon oxide. Other types of gate electrode and gate dielectric materials may also be useful. A gate, for example, may be a gate conductor along a first or wordline direction. The gate conductor forms a common gate for a row of memory cells.

As discussed, a S/D region may include LDD and halo regions (not shown). Dielectric spacers (not shown) may be provided on the gate sidewalls of the transistors to facilitate forming transistor halo, LDD and transistor S/D regions. It is understood that not all transistors include LDD and/or halo regions.

After forming the cell selector unit and other transistors, back end of line (BEOL) processing is performed. The BEOL process includes forming interconnects in interlevel dielectric (ILD) layers 590. The interconnects connect the various components of the IC to perform the desired functions. An ILD layer includes a metal level 594 and a contact level 592. Generally, the metal level includes conductors or metal lines 595 while the contact level includes contacts 593. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE) may also be employed to form metal lines.

A device may include a plurality of ILD layers or levels. For example, x number of ILD levels may be provided. As illustrated, the device includes 5 ILD levels (x=5). Other number of ILD levels may also be useful. The number of ILD levels may depend on, for example, design requirements or the logic process involved. A metal level of an ILD level may be referred to as $M_i$, where i is from 1 to x and is the $i^{th}$ ILD level of x ILD levels. A contact level of an ILD level may be referred to as where i is the $i^{th}$ ILD level of x ILD levels.

The BEOL process, for example, commences by forming a dielectric layer over the transistors and other components formed in the FEOL process. The dielectric layer may be silicon oxide. For example, the dielectric layer may be silicon oxide formed by chemical vapor deposition (CVD). The dielectric layer serves as a premetal dielectric layer or first contact layer of the BEOL process. The dielectric layer may be referred to as CA level of the BEOL process. Contacts are formed in the CA level dielectric layer. The contacts may be formed by a single damascene process. Via openings are formed in the dielectric layer using mask and etch techniques. For example, a patterned resist mask with openings corresponding to the vias is formed over the dielectric layer. An anisotropic etch, such as RIE, is performed to form the vias, exposing contact regions below, such as S/D regions and gates. A conductive layer, such as tungsten is deposited on the substrate, filling the openings. The conductive layer may be formed by sputtering. Other techniques may also be useful. A planarization process, such as CMP, is performed to remove excess conductive material, leaving contact plugs in the CA level.

After forming contacts in the CA level, the BEOL process continues to form dielectric layer over the substrate, covering the CA level dielectric layer. The dielectric layer, for example, serves as a first metal level M1 of the first ILD layer. The upper dielectric layer, for example, is a silicon oxide layer. Other types of dielectric layers may also be useful. The dielectric layer may be formed by CVD. Other techniques for forming the dielectric layer may also be useful.

Conductive lines are formed in the M1 level dielectric layer. The conductive lines may be formed by a damascene technique. For example, the dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. Excess conductive materials are removed by, for example, CMP, leaving planar surface with the conductive line and M1 dielectric. The first metal level M1 and CA may be referred as a lower ILD level.

The process continues to form additional ILD layers. For example, the process continues to form upper ILD layers or levels. The upper ILD levels may include ILD level 2 to ILD level x. For example, in the case where x=5 (5 levels), the upper levels include ILD levels from 2 to 5, which includes M2 to M5. The number of ILD layers may depend on, for example, design requirements or the logic process involved. The upper ILD layers may be formed of silicon oxide. Other types of dielectric materials, such as low k, high k or a combination of dielectric materials may also be useful. The ILD layers may be formed by, for example, CVD. Other techniques for forming the ILD layers may also be useful.

The conductors and contacts of the upper ILD layers may be formed by dual damascene techniques. For example, vias and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, plating techniques. Excess conductive material is removed by, for example, CMP, forming conductors and contacts in an upper ILD layer.

A dielectric liner (not shown) may be disposed between ILD levels and on the substrate. The dielectric liner, for example, serves as an etch stop layer. The dielectric liner may be formed of a low k dielectric material. For example, the dielectric liner may be nBLOK. Other types of dielectric materials for the dielectric liner may also be useful.

The uppermost ILD level (e.g., M5) may have different design rules, such as critical dimension (CD), than the lower ILD levels. For example, Mx may have a larger CD than metal levels M1 to Mx-1 below. For example, the uppermost metal level may have a CD which is 2× or 6× the CD of the metal levels below.

As shown, S/D contacts are disposed in the CA level. The S/D contacts are coupled to the first and second S/D regions of the select transistor. Other S/D contacts to other S/D regions of transistors may also be provided. The CA level may include a gate contact (not shown) coupled to the gate of the select transistor. The gate contact may be disposed in another cross-section of the device. The gate contact may be coupled to a wordline WL (not shown) in M1. Providing the WL in other metal levels may also be useful. The contacts may be tungsten contacts. Other types of contacts may also be useful. Other S/D and gate contacts for other transistors may also be provided.

As described, metal lines are provided in M1. The metal lines are coupled to the S/D contacts. In one embodiment, a SL is coupled to the second S/D region of the select transistor. As for the first S/D contact, it may be coupled to contact pad or island in M1. The contact pads provide connections to upper ILD levels. The metal lines or pads may be formed of copper or copper alloy. Other types of conductive material may also be useful.

As for the upper ILD, for example, from 2 to 5, they include contacts in the via level and contact pads/metal lines in the metal level. The contacts and contact pads provide connection from M5 to the first S/D region of the select transistor.

A pad level 550 is disposed over the uppermost ILD level. For example, a pad dielectric level is disposed over Mx. In the case where the device includes 5 metal levels, the pad level is disposed over M5. A dielectric liner 558 may be disposed between the uppermost metal level and pad level. The dielectric liner, for example, serves as an etch stop layer during via etch process and it may also serve as a diffusion barrier layer for, for example, copper (Cu) layer. The dielectric liner may be a low k dielectric liner. For example, the dielectric liner may be nBLOK. Other suitable types of dielectric materials for the dielectric liner may also be useful.

The pad level includes lower, intermediate and upper pad dielectric layers 560, 570 and 580. As shown, the intermediate pad dielectric layer is disposed between lower and upper pad dielectric layers. The lower and intermediate pad dielectric layers form a lower pad level 550*l* while the upper pad dielectric layer forms an upper pad level 550*u*.

The lower pad dielectric layer serves as a lower passivation layer. The lower passivation layer, for example, may be a nitride passivation layer. The intermediate pad dielectric layer and the lower passivation layer form a pad via level. The intermediate pad dielectric layer, for example, may be a silicon oxide layer. Other types of pad dielectric layers may also be useful. As for the upper pad dielectric layer, it covers all chip region except for pad opening areas to prevent from moisture absorption and mechanical scratch. The upper passivation layer, for example, may be a nitride passivation layer.

As described, the upper and lower passivation layers are silicon nitride passivation layers. Providing other types of passivation layers may also be useful. For example, a passivation layer may be a passivation stack having multiple passivation layers. A passivation stack may be an oxide/nitride stack, with nitride being a top layer of the stack. Furthermore, it is understood that the upper and lower passivation layers, may be similar or of different types of passivation layers.

A pad interconnect 562 is disposed in the pad level. The interconnect includes a pad via contact 564 and a contact pad 566. The pad via contact is disposed in the lower passivation or pad via level. The pad via contact penetrates the dielectric liner, contacting an interconnect in the metal level below. For example, the pad via contact electrically connects to an interconnect in M5. Above the pad via contact is the contact pad. The contact pad is disposed in the upper pad level. As shown, the contact pad is disposed over the lower contact level, with the upper passivation layer covering or lining it. An opening in the upper passivation layer exposes the contact pad for subsequent wire bonding to provide external connections to the device.

The pad interconnect, in one embodiment, is an aluminum pad interconnect. Other conductive materials may also be useful to serve as the pad interconnect. In one embodiment, the via contact and contact pad are an integral unit. For example, the via contact and contact pad are formed from the same conductive layer. For example, the via contact and contact pad are formed from the same aluminum layer. The via contact and contact pad may also be a non-integral unit. Other suitable configurations of the pad interconnects may also be useful. The thickness of the aluminum contact pad, for example, may be about 1-3 µm. Other suitable thicknesses may also be useful.

The storage unit 510 of the memory cell is disposed in the lower pad level. For example, the storage unit is disposed in the lower and intermediate pad dielectric layers or pad via level 5501. The storage unit includes a storage stack 530 having various layers. The storage stacks may be a magnetic storage stack. The magnetic storage stack is, for example, a MTJ stack, similar to those describe in FIGS. 2*a*-2*b*. Common elements may not be described or described in detail. The MTJ stack may include various layers configured as a top-pinned or bottom pinned MTJ stack. The MTJ stack forms a storage unit of a MRAM cell.

The MTJ stack, for example, includes a storage plug 220 disposed between top and bottom electrodes. The bottom electrode is coupled to a contact pad in the metal level below. For example, the bottom electrode is coupled to a contact pad in M5. This provides connections of the MTJ stack to the first S/D region of the cell select transistor. As for the top electrode, it is exposed at the top of the intermediate dielectric layer.

A cell interconnect 569 is disposed in the upper pad level 550*u*. For example, the cell interconnect is disposed over the lower pad level and is lined by the upper pad dielectric layer. The cell interconnect may be an aluminum cell interconnect. Other suitable conductive materials may also be useful to serve as the cell interconnect. In one embodiment, the cell interconnect 569 and pad interconnect 562 are formed from the same layer. For example, they are both formed of the same material from the same layer. In one embodiment, the pad and cell interconnects are aluminum interconnects. The cell interconnect is coupled to the top electrode of the MTJ stack.

The cell interconnect may be an elongated member and coupled to a via pad contact which is connected to a contact pad in a lower metal level. For example, the cell interconnect may include a pad via contact in the lower pad level which is connected to a contact pad in M5. The contact pad may be connected to a via contact. Similar to the via contacts and contact pads enabling connection of the memory stack to the first S/D region of the select transistor, the top electrode of the memory cell may be connected to a BL (not shown), for example, disposed on M2. This provides connection of the first S/D region of the cell selector to the storage unit and from the storage unit to the BL. It is understood that, although SL and WL are disposed in M1 while BL is disposed in M2, other configurations of lines may also be useful. For example, SL and WL may be disposed in M2 while BL is disposed in M1. Generally, lines disposed along the same direction may be disposed in the same level. Providing lines which are disposed along the same direction in different levels may also be useful.

FIGS. 6*a*-6*i* show simplified cross-sectional views of a process of forming an embodiment of a device 600. The process includes forming a memory cell. The memory cell, for example, may be a NVM memory cell. The memory cell, in one embodiment, is a magnetoresistive NVM cell, such as a STT-MRAM cell. The memory cell, for example, is similar to that described in FIG. 5. Common elements may not be described or described in detail. The cross-sectional views, for example, are along the bitline direction. Although the cross-sectional views show one memory cell, it is understood that the device includes a plurality of memory cells of, for example, a memory array. In addition, the memory cell can be formed simultaneously with CMOS logic devices on the same substrate.

The simplified cross-sectional views illustrate an uppermost ILD level 590. For example, a substrate (not shown) has been processed with FEOL and BEOL processing, as already described, to include the uppermost ILD level. FEOL processing, for example, forms transistors, including a select transistor of the memory cell. Other types of devices may also be formed on the same substrate. BEOL processing forms interconnects in ILD levels. The uppermost ILD level includes and a via level 592 and a metal level 594. For example, the uppermost ILD level includes V4 and M5. The top metal level, as shown, includes interconnects. For example, interconnect 595*b* is a cell contact pad for coupling to a storage unit and interconnect 595*a* is coupled to a pad interconnect. The interconnects, for example, are copper interconnects. Other suitable types of interconnects may also be useful.

Figure 6A:
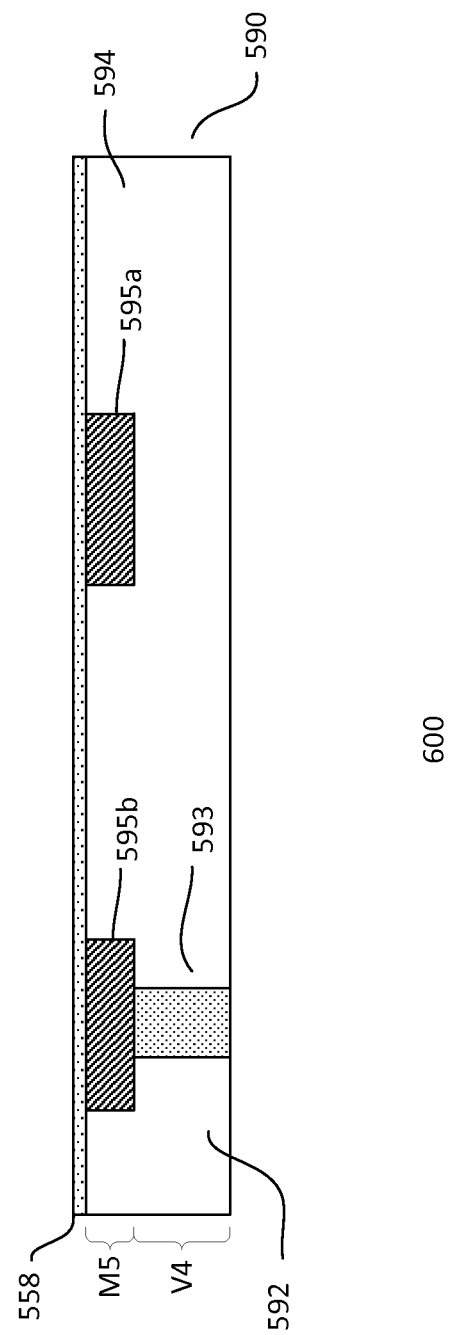

Referring to FIG. 6*a*, a dielectric liner 558, in one embodiment, is disposed above the uppermost metal level. The dielectric liner, for example, serves as an etch stop layer. The dielectric liner may be a low k dielectric liner. For example, the dielectric liner may be nBLOK. Other types of dielectric materials for the dielectric liner may also be useful. The dielectric liner, for example, is formed by CVD. Other suitable techniques for forming the dielectric liner may also be useful.

The process continues to form a pad level. As shown in FIG. 6*b*, a lower passivation layer 560 is formed on the uppermost dielectric layer. For example, the lower passivation layer is formed on the dielectric liner 558. The lower passivation layer, in one embodiment, is a combination of nitride and oxide passivation layer. The lower passivation layer may be formed by CVD having a nitride thickness of about 200 nm and oxide thickness of about 600 nm. Other suitable forming techniques or suitable thicknesses for the passivation layer may also be useful. In some embodiments, other types of passivation layers may be provided.

In one embodiment, the substrate is subjected to an alloying process. The alloying process includes annealing the substrate to around 400° C. with duration of about 1-2 hours and with hydrogen ambient. Other suitable temperature, duration and ambient may be also used. The alloying process is applied to passivate dangling bonds in gate oxide and consequently improve device performance or reliability.

Figure 6C:
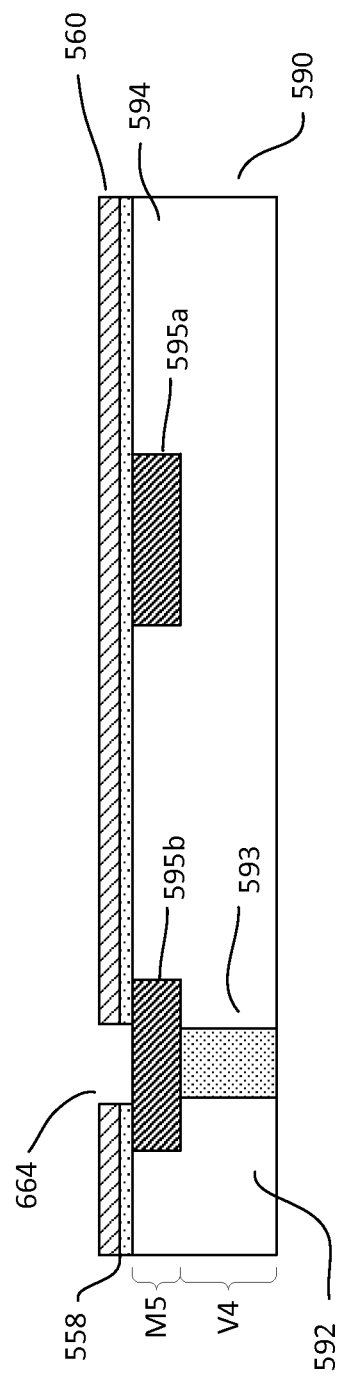

In FIG. 6*c*, the lower passivation layer is patterned to form a storage unit opening 664. The storage unit opening, for example, is a via opening for accommodating a lower portion of a subsequently formed storage stack. The storage unit opening exposes a cell contact pad 595*b* in the metal level below. The opening may be formed by mask and etch techniques. For example, a patterned photoresist mask may be formed over the lower passivation layer, serving as an etch mask. An etch, such as RIE, may be performed to pattern the lower passivation layer using the patterned resist etch mask. In one embodiment, the etch transfers the pattern of the mask to the lower passivation layer, including the dielectric liner to expose the cell contact pad below.

Figure 6D:
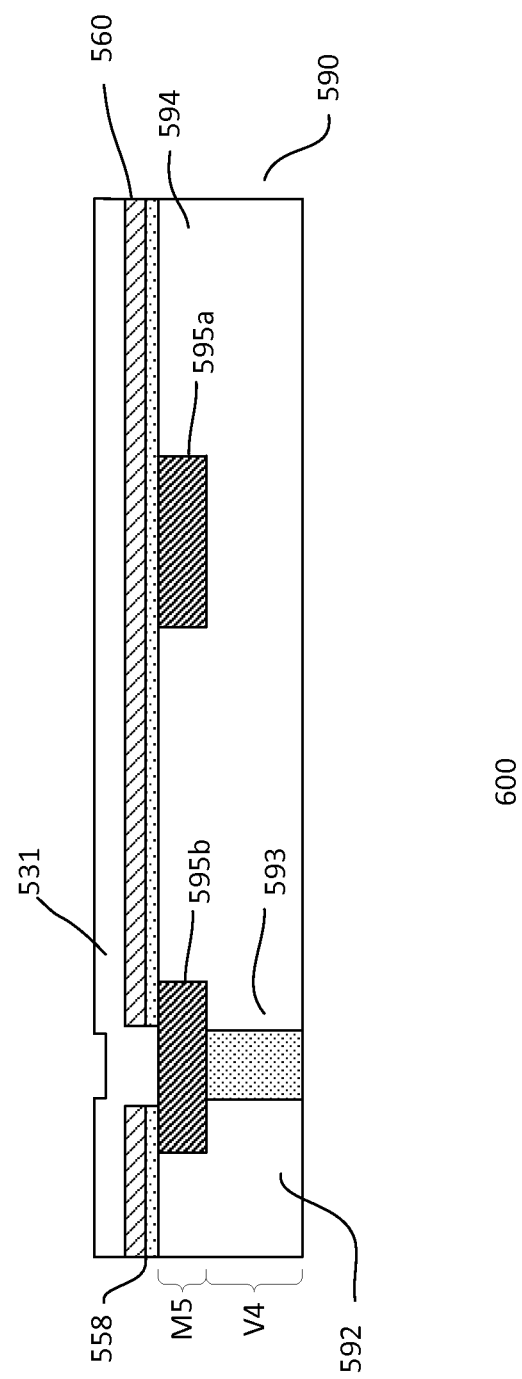

Referring to FIG. 6*d*, the process continues to form a storage stack. The storage stack may be a magnetic storage stack. The magnetic storage stack is, for example, a MTJ stack, similar to those describe in FIGS. 2*a*-2*b*. The MTJ stack may include various layers configured as a top-pinned or bottom pinned MTJ stack. The MTJ stack forms a storage unit of a MRAM cell.

The MTJ stack, for example, includes a storage plug disposed between top and bottom electrodes. The bottom electrode is coupled to a contact pad in the metal level below. For example, the bottom electrode is coupled to a contact pad 595*b* in M5. This provides connections of the MTJ stack to the first S/D region 545 of the cell select transistor as described in FIG. 5. As for the top electrode, it is exposed at the top of the intermediate dielectric layer.

Figure 6E:
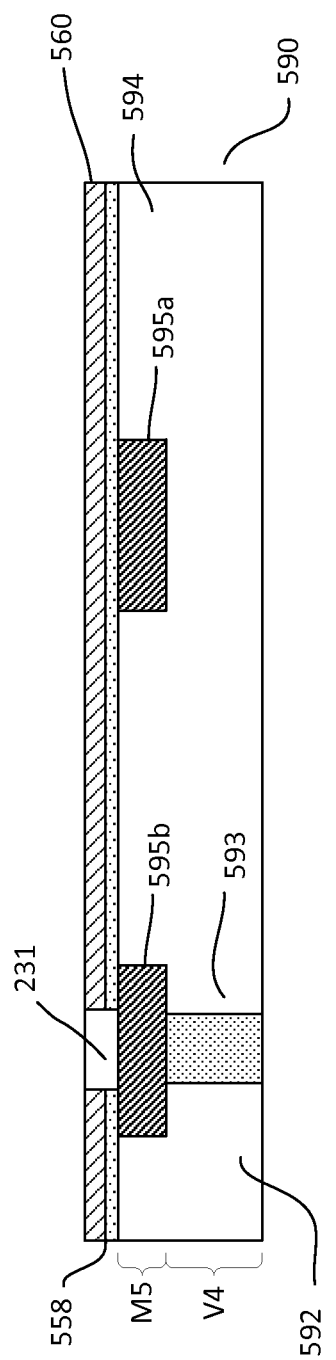
Figure 6F:
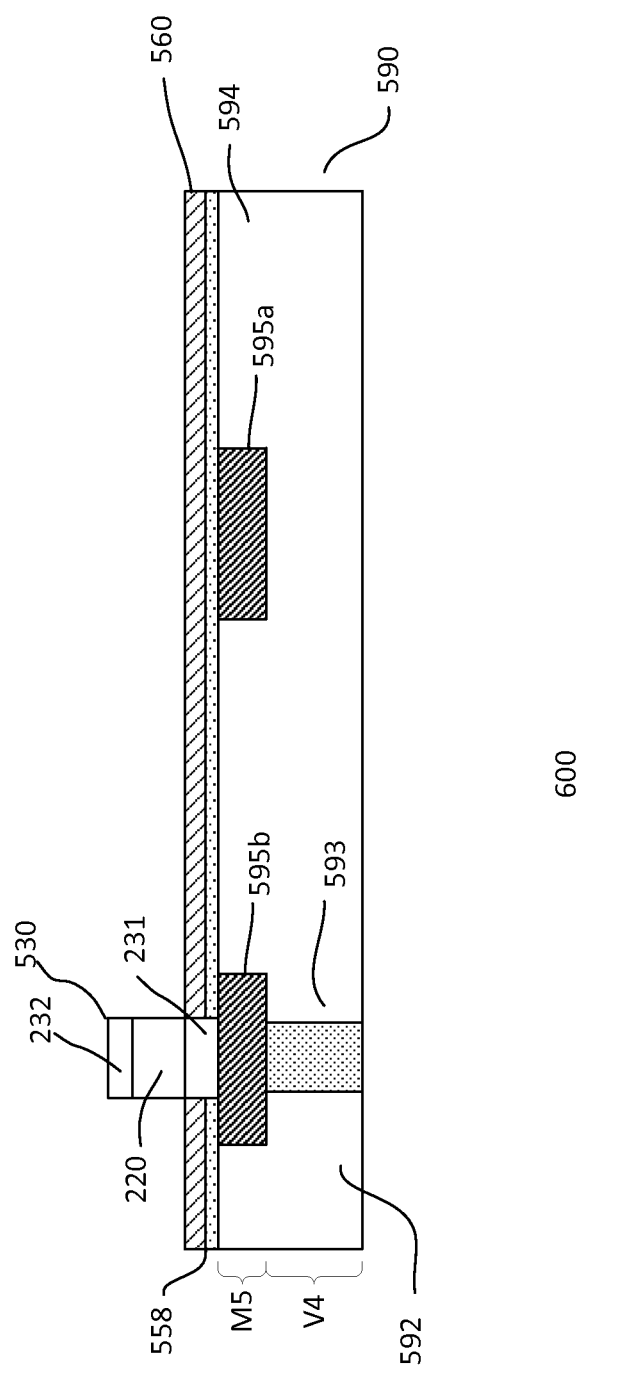

The various layers of the MTJ stack are formed on the substrate. For example, the various layers of the MTJ stack are sequentially formed over the lower passivation layer and filling the opening. After the opening 644 is formed, a bottom electrode layer 531, such as Ta or TaN is deposited over the lower passivation layer and fills the opening as shown in FIG. 6*d*. A chemical mechanical polishing (CMP) process is applied to form an embedded bottom electrode in the opening 644 and remove excess bottom electrode layer in other areas. Other suitable bottom electrode materials and techniques may be employed. The bottom electrode 231 fills the opening and the surface is flat as shown in FIG. 6*e*. The process continues to form remaining layers of the MTJ stack, such as the storage plug 220 and the top electrode 232, on top of the bottom electrode by physical vapor deposition (PVD) process. The layers of the MTJ stack are patterned to form the MTJ stack 530 as shown in FIG. 6*f*. Patterning the layers maybe achieved with a non-conducting mask and etch techniques. After forming the MTJ stack, the non-conducting mask layer used to pattern the MTJ stack is removed if dielectric ARC or oxide hard mask layer is used. Other suitable techniques for forming the MTJ stack may also be useful.

Figure 6G:
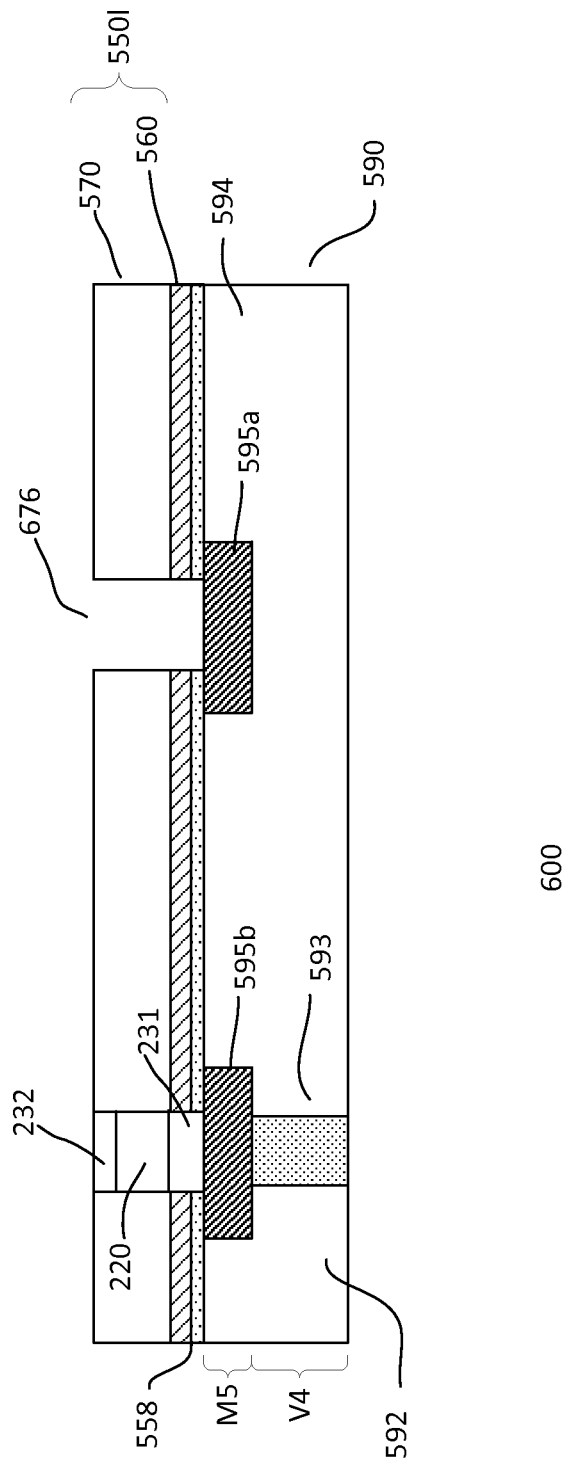

An intermediate dielectric layer 570 is formed on the substrate, as shown in FIG. 6*g*. The dielectric layer is formed over the lower passivation layer and sufficiently covers the MTJ stack. The intermediate dielectric layer, for example, is silicon oxide. Other types of intermediate dielectric layers may also be useful. The intermediate dielectric layer may be formed by CVD. Other techniques for forming the dielectric layer may also be useful.

A planarizing process is performed on the substrate, planarizing the intermediate dielectric layer. The planarizing process, for example, is a CMP process. The CMP produces a planar top surface between the top of the MTJ stack and intermediate dielectric layer. The intermediate and lower passivation layers serve as the lower pad or pad via level 550*l*. The lower pad level is patterned to form a pad via opening 676. The pad via opening is patterned by mask and etch techniques. The pad via opening penetrates through the various layers of the lower pad level and the dielectric liner. This exposes the interconnect 595*a* in the lower metal level. After forming the pad via opening, the mask layer is removed. For example, the mask and ARC layers are removed.

Figure 6H:
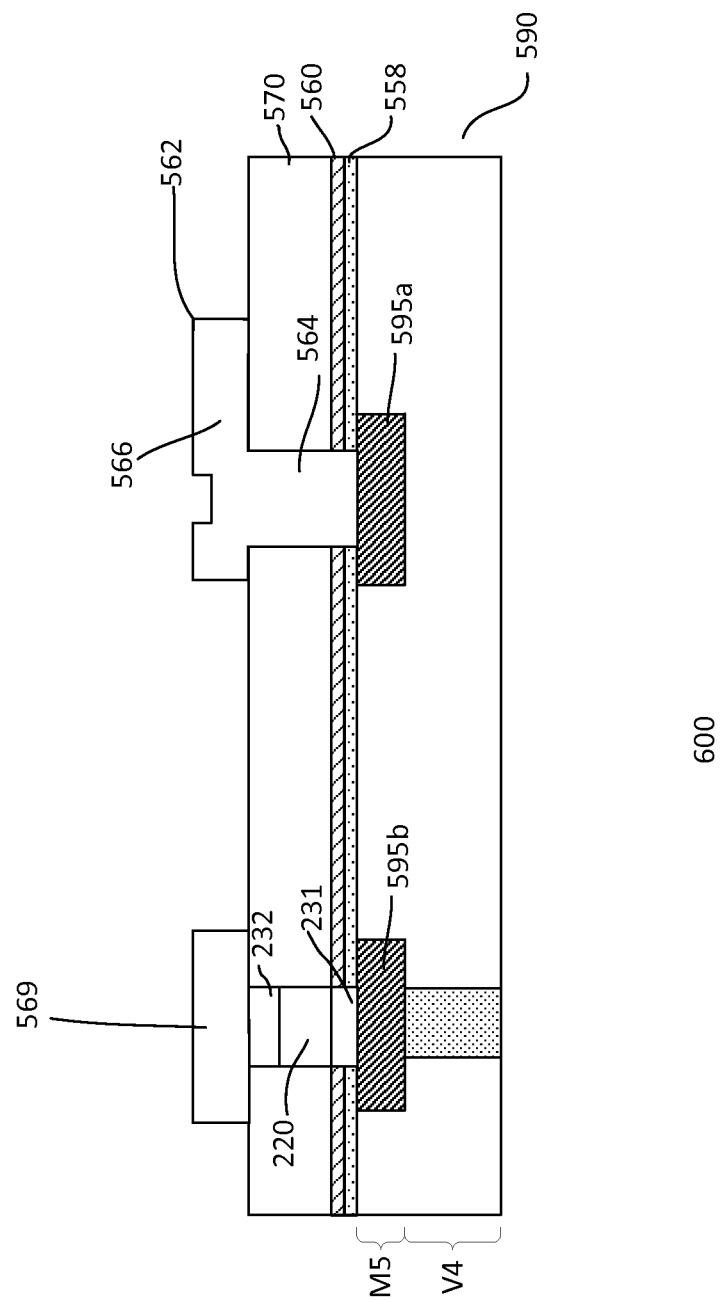

Referring to FIG. 6*h*, a conductive layer is formed on the substrate. The conductive layer covers the intermediate dielectric layer and MTJ stack as well as filling the pad via opening. The conductive layer should be sufficiently thick to serve as a pad interconnect. The thickness of the conductive layer above the lower pad level, for example, is about 2.8 μm. Other suitable thicknesses may also be useful. In one embodiment, the conductive layer is an aluminum layer. For example, the aluminum layer is used to form an aluminum pad interconnect. Other suitable types of conductive layers may also be useful. The conductive layer may be formed by, for example, sputtering. Other suitable techniques for forming the conductive layer may also be useful.

The conductive layer is patterned to form a pad interconnect 562 and cell interconnect 569. Patterning the conductive layer to form the pad interconnect may be achieved by mask and etch techniques. For example, a patterned photoresist mask may be formed over the conductive layer. An etch, such as RIE, may be used to pattern the conductive layer with a patterned resist mask. In one embodiment, the pad interconnect includes a pad via contact 564 in the via opening and a pad contact 566 over the lower passivation layer. The pad contact and cell interconnect, for example, are disposed over the intermediate dielectric layer. After patterning the conductive layer, the mask layer is removed. For example, the mask and ARC layers are removed.

The cell interconnect is electrically coupled to the upper electrode of the storage stack and a via contact (not shown) in the lower pad level. The via contact, for example, is coupled to contact pads and vias in the ILD levels for interconnection to a bit line (BL) in one of the ILD levels.

Figure 6I:
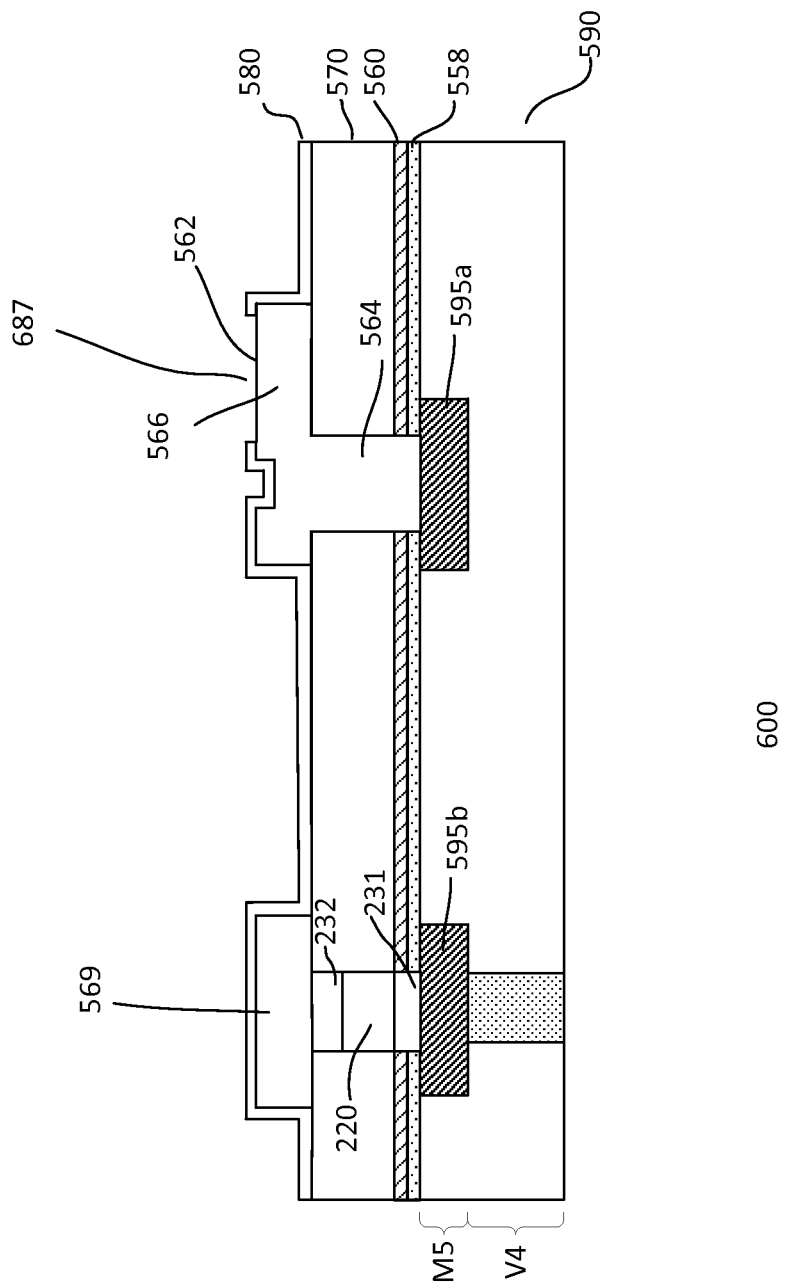

As shown in FIG. 6i, an upper passivation layer 580 is formed on the substrate. For example, the upper passivation layer covers or lines the lower pad level and interconnects. The upper passivation layer, in one embodiment, is a nitride passivation layer. The upper passivation layer may be formed by CVD. Other suitable forming techniques for the passivation layer may also be useful. In some embodiments, other types of passivation layers may be provided. For example, the upper passivation layer may be a passivation stack, such as nitride/oxide stack with the nitride layer on top having a thickness of about 500 nm and the oxide having a thickness of about 500 nm. Other suitable thicknesses may also be useful.

A pad opening 687 is formed in the upper passivation layer. The pad opening exposes the pad interconnect 562. For example, the pad opening exposes the pad contact of the pad interconnect. The pad opening is formed by, for example, mask and etch techniques. After forming the pad opening, the mask and ARC layers are removed. The pad opening provides access for a wire bond for external connection to the device.

As described, the device includes one pad interconnect and one memory cell. However, it is understood that a device may include numerous memory cells and pad interconnects which are bonded with wire bonds.

Although the storage stack of the memory cell as described above includes a MTJ stack such as that shown in FIGS. 2a-2b, it is understood that other suitable configurations of MTJ stack and other types of MTJ stack may be used. In addition, the process as described in FIGS. 6a-6i is also applicable to other suitable types of memory cell, such as but not limited to memory cells which are sensitive to high temperature processing.

The embodiment as described in FIGS. 6a-6i results in advantages. For example, the alloying process is important to maintain the performance and reliability of devices other than the MTJ stack. In the embodiment as described, the alloying process which requires a higher processing temperature is performed prior to formation of the MTJ stack. Thus, the performance and reliability of devices other than the MTJ stack is not compromised. In addition, the process for forming the cell and pad interconnects requires low temperature processing. Since the MTJ stack will not be subject to high temperature processing, the performance and stability of the MTJ stack will not be affected, allowing a reliable memory cell to be formed. Moreover, the process as described is highly compatible with logic processing or technology. This avoids the investment of new tools and does not require creating new low temperature modules or processing, providing a cost effective solution. Also, since conductive metal with subtractive etch is used to form top connection of MTJ, it eliminates the concerns of top connection by damascene process such as Cu interconnect where the trench etch process may etch too much into dielectric, undesirably exposing the MTJ which leads to contamination.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
   providing a substrate;
   performing front end of line processing to form circuit components on the substrate; and
   performing back end of line processing to form an uppermost inter level dielectric (ILD) layer of the device, the uppermost ILD layer includes a metal level over a via level, wherein the metal level comprises first and second metal lines having top surfaces which are coplanar with a top surface of the uppermost ILD layer;
   forming a pad level over the uppermost ILD layer, wherein forming the pad level comprises
      forming a lower passivation layer and an intermediate dielectric layer over the lower passivation layer, and
      patterning the lower passivation and intermediate dielectric layers to form a pad via opening which exposes a portion of the top surface of the second metal line in the uppermost ILD layer;
   providing a storage unit of a memory cell in the pad level, wherein a bottom surface of the storage unit completely contacts the top surface of the first metal line of the uppermost ILD layer without covering the entire first metal line, and wherein
   top surface of the storage unit is coplanar with top surface of the intermediate dielectric layer; and
   forming a cell interconnect and a pad interconnect in the pad level, wherein forming the cell interconnect and the pad interconnect comprises
      forming a conductive layer over the intermediate dielectric layer, wherein the conductive layer fills the pad via opening, and
      patterning the conductive layer to simultaneously form the cell interconnect and pad interconnect, wherein the cell interconnect is a cell contact pad which is formed on top of and in direct contact with the top surfaces of the storage unit and the intermediate dielectric layer while the pad interconnect includes a pad via contact and a contact pad, wherein the pad via contact extends beyond a bottom surface of the intermediate dielectric layer to be in direct contact with the exposed portion of the second metal line and the contact pad is disposed on the intermediate dielectric layer.

2. The method of claim 1 wherein:
   the storage unit of the memory cell comprises a magnetic tunneling junction (MTJ) stack; and comprising
   performing an alloying process prior to providing the MTJ stack of the memory cell in the pad level.

3. The method of claim 1 wherein the cell contact pad covers the entire top surface of the storage unit.

4. The method of claim 1 wherein the lower passivation layer comprises a combination of nitride and oxide passivation layers.

5. The method of claim 1 wherein:
the storage unit of the memory cell comprises a magnetic tunneling junction (MTJ) stack; and comprising
performing an alloying process after forming the lower passivation layer and prior to providing the MTJ stack.

6. The method of claim 1 wherein:
the storage unit comprises a magnetic tunneling junction (MTJ) stack which comprises a bottom electrode, a top electrode and a MTJ storage plug in between the top and bottom electrodes, wherein the cell interconnect is in direct contact with and covers a top surface of the top electrode.

7. The method of claim 6 comprising forming an etch stop layer over the uppermost ILD layer prior to forming the lower passivation layer, wherein the etch stop layer covers the top surfaces of the first and second metal lines and separates the lower passivation layer from the intermediate dielectric layer.

8. The method of claim 7 wherein forming the storage unit of the memory cell in the pad level comprises:
patterning the etch stop layer and the lower passivation layer to form a storage unit opening;
forming a bottom electrode layer over the lower passivation layer and fills the storage unit opening defined in the etch stop and lower passivation layers;
planarizing the bottom electrode layer to form the bottom electrode in the storage unit opening;
depositing remaining MTJ stack layers over the lower passivation layer and the bottom electrode; and
patterning the remaining MTJ stack layers to form the storage plug and the top electrode of the MTJ stack over the bottom electrode.

9. The method of claim 1 comprising forming an etch stop layer over and contacts the uppermost ILD layer, wherein the lower passivation layer is disposed over the etch stop layer.

10. The method of claim 9 comprising patterning the etch stop layer and the lower passivation layer to form a storage unit opening to accommodate a lower portion of the storage unit of the memory cell.

11. The method of claim 1 wherein the conductive layer comprises an aluminum layer.

12. The method of claim 1 comprising forming an upper passivation layer which conformally lines the intermediate dielectric layer and the cell and pad interconnects.

13. The method of claim 12 comprising patterning the upper passivation layer to form a pad opening which exposes the contact pad of the pad interconnect for subsequent wire bonding to provide external connections to the device.

14. The method of claim 12 wherein the upper passivation layer comprises a nitride and an oxide stack.

15. A device comprising:
a substrate comprising circuit components and a plurality of dielectric layers over the substrate, wherein the plurality of dielectric layers comprises an uppermost inter level dielectric (ILD) layer of the device, the uppermost ILD layer includes a metal level over a via level, wherein the metal level comprises first and second metal lines having top surfaces which are coplanar with a top surface of the uppermost ILD layer;
a pad level disposed over the uppermost ILD layer, wherein the pad level comprises a lower passivation layer and an intermediate dielectric layer over the lower passivation layer, and wherein the lower passivation and intermediate dielectric layers comprise a pad via opening which exposes a portion of the top surface of the second metal line in the uppermost ILD layer;
a storage unit of a memory cell disposed in the pad level, wherein a bottom surface of the storage unit completely contacts the top surface of the first metal line of the uppermost ILD layer without covering the entire first metal line, and wherein top surface of the storage unit is coplanar with top surface of the intermediate dielectric layer; and
a cell interconnect and a pad interconnect are disposed in the pad level, wherein the cell interconnect is a cell contact pad which is disposed on top of and in direct contact with the top surfaces of the storage unit and the intermediate dielectric layer while the pad interconnect includes a pad via contact and a contact pad, wherein the pad via contact extends beyond a bottom surface of the intermediate dielectric layer to be in direct contact with the exposed portion of the second metal line and the contact pad is disposed on the intermediate dielectric layer.

16. The device of claim 15 wherein the cell contact pad covers the entire top surface of the storage unit.

17. The device of claim 15 comprising an etch stop layer disposed over and contacts the uppermost ILD layer and the top surfaces of the first and second metal lines, wherein:
the lower passivation layer is disposed over the etch stop layer;
the etch stop layer and the lower passivation layer comprise a storage unit opening; and
a lower portion of the storage unit of the memory cell is disposed in the storage unit opening defined in the etch stop and lower passivation layers.

18. The device of claim 17 wherein:
the storage unit of the memory cell comprises a magnetic tunneling junction (MTJ) stack; and
the cell and pad interconnects comprise aluminum interconnects.

19. The device of claim 18 wherein the MTJ stack comprises a bottom electrode, a MTJ storage plug and a top electrode, wherein the bottom electrode is disposed in the storage unit opening.

20. The device of claim 15 comprising an upper passivation layer disposed over the intermediate dielectric layer, wherein the upper passivation layer conformally lines the intermediate dielectric layer and the cell and pad interconnects.

* * * * *